(12) United States Patent
Ye

(10) Patent No.: US 8,613,595 B2
(45) Date of Patent: Dec. 24, 2013

(54) FAN HOLDER AND HEAT DISSIPATION DEVICE USING THE SAME

(75) Inventor: Zhen-Xing Ye, Shenzhen (CN)

(73) Assignees: Hong Fu Jin Precision Industry (ShenZhen) Co., Ltd, Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 483 days.

(21) Appl. No.: 12/977,082

(22) Filed: Dec. 23, 2010

(65) Prior Publication Data

US 2012/0114500 A1     May 10, 2012

(30) Foreign Application Priority Data

Nov. 5, 2010   (CN) .......................... 2010 1 0533390

(51) Int. Cl.
  *F04D 29/64*     (2006.01)
(52) U.S. Cl.
  USPC ........................................ 415/213.1; 361/697
(58) Field of Classification Search
  USPC ...................................................... 415/213.1
  See application file for complete search history.

(56) References Cited

U.S. PATENT DOCUMENTS

| 5,400,993 | A | * | 3/1995 | Hamilton .................... 248/279.1 |
| 5,706,169 | A | * | 1/1998 | Yeh ............................... 361/690 |
| 5,774,335 | A | * | 6/1998 | Pare et al. ..................... 361/704 |
| 5,797,568 | A | * | 8/1998 | Canton Gongora et al. ........................... 248/122.1 |
| 5,825,622 | A | * | 10/1998 | Rife et al. ..................... 361/704 |
| 6,487,079 | B2 | * | 11/2002 | Katsui ........................... 361/704 |
| 6,894,898 | B2 | * | 5/2005 | Liu ................................ 361/697 |

FOREIGN PATENT DOCUMENTS

TW           200740349  A  *  10/2007

* cited by examiner

*Primary Examiner* — Nathaniel Wiehe
*Assistant Examiner* — Kayla McCaffrey
(74) *Attorney, Agent, or Firm* — Altis Law Group, Inc.

(57) ABSTRACT

An exemplary fan holder is adapted for fixing a fan onto a heat sink. The fan holder is strip-shaped, and includes a top side portion, a bottom side portion, a front side portion and a rear side portion joined together. Each of the side portions of the fan holder includes a slide portion and a sheath connected to each other. A position where the slide portion and the sheath are connected can be adjusted to change a length of the side portion.

16 Claims, 4 Drawing Sheets

FAN HOLDER AND HEAT DISSIPATION DEVICE USING THE SAME

BACKGROUND

1. Technical Field

The disclosure relates to a fan holder for fixing a fan on a heat sink, and a heat dissipation device using the fan holder.

2. Description of Related Art

Nowadays, numerous kinds of heat dissipation devices are used to dissipate heat generated by electronic devices. Generally, a heat dissipation device includes a heat sink and a fan fastened on the heat sink via a fan holder. The fan holder is designed with a size matching the size of the fan and the heat sink, so that the fan can be fitly mounted on the heat sink. If the fan and the heat sink are replaced with a fan and the heat sink of another size, the fan holder does not match the fan and the heat sink. Another fan holder with another size to fit the new fan and heat sink must be provided, resulting in increased costs.

What is needed, therefore, is a fan holder and a heat dissipation device using the fan holder which can overcome the limitations described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
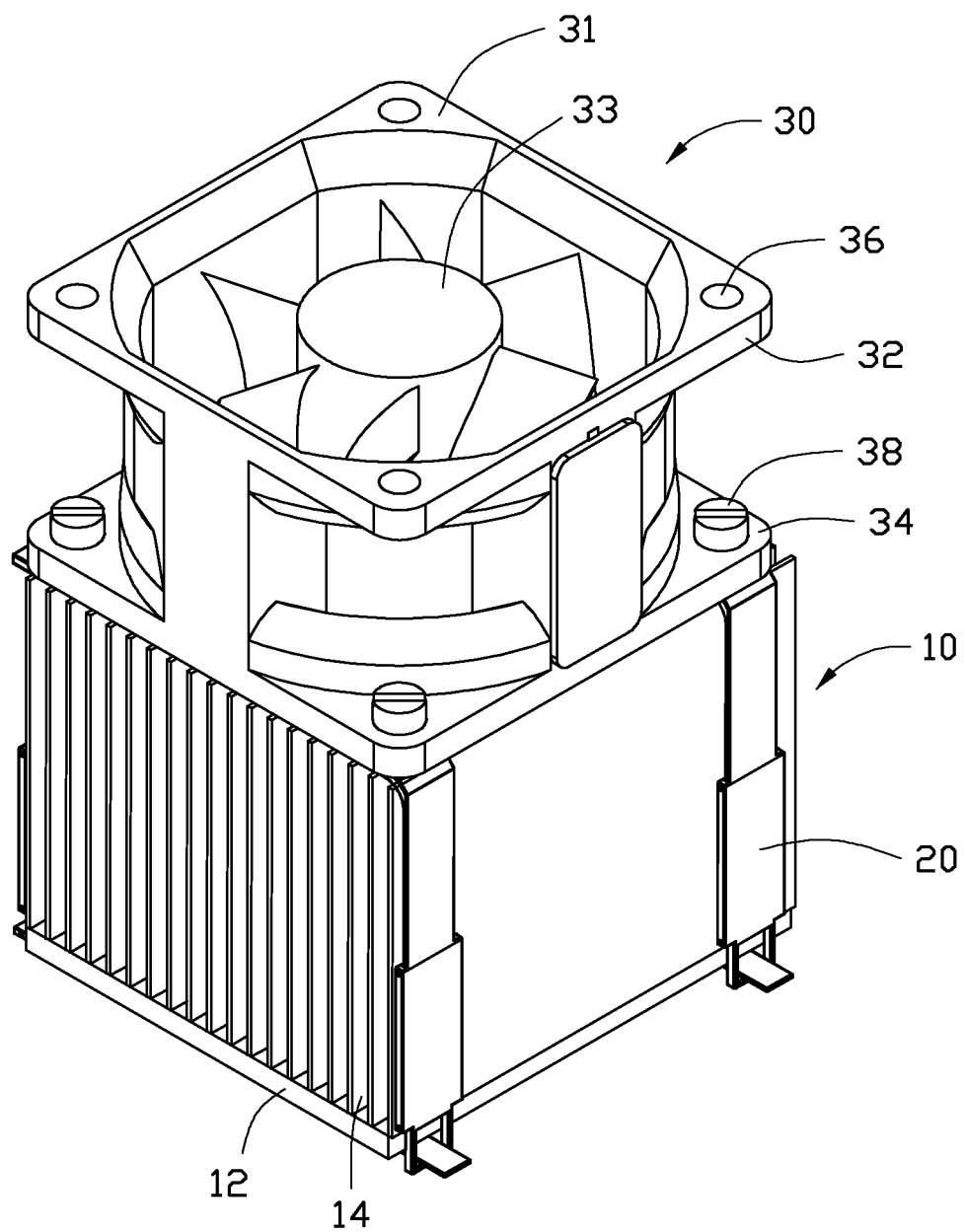
FIG. 1 is an isometric view of a heat dissipation device in accordance with a first embodiment of the disclosure.
Figure 2:
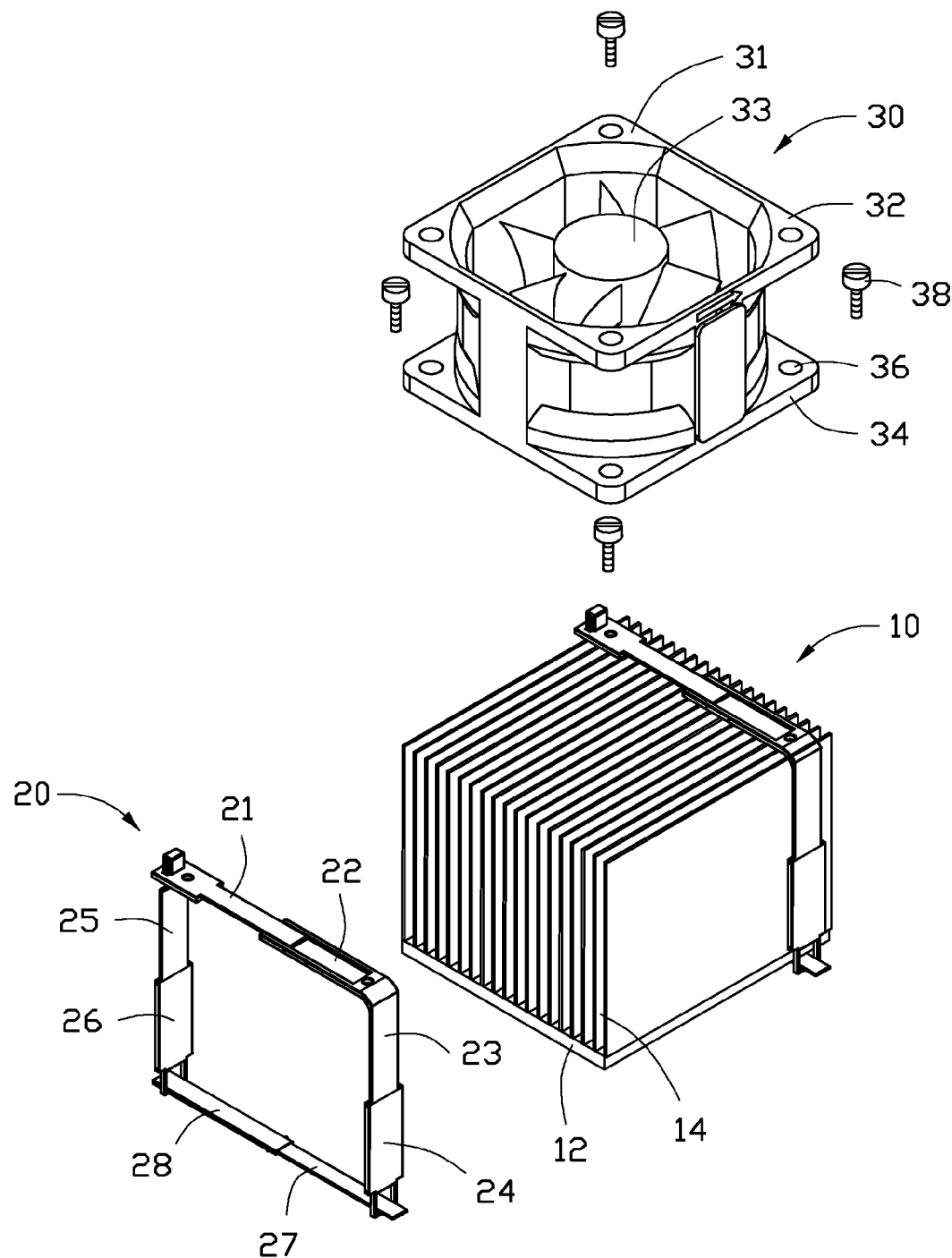
FIG. 2 is an exploded view of the heat dissipation device of FIG. 1.

Referring to FIGS. 1-2, a heat dissipation device in accordance with a first embodiment of the disclosure is provided for cooling an electronic device (not shown). The heat dissipation device comprises a heat sink 10 for thermally contacting the electronic device, a fan 30 placed above the heat sink 10, and two fan holders 20 fixing the fan 30 on the heat sink 10.

The heat sink 10 is integrally made of metal such as aluminum, copper or an alloy thereof. The heat sink 10 includes a heat conducting plate 12, and a plurality of fins 14 extending upwardly from a top face of the heat conducting plate 12.

The fan 30 is generally rectangular in shape, and includes a fan frame 31 and an impeller 33 received in the fan frame 31. An upper flange 32 and a lower flange 34 parallel to the upper flange 32 extend outwardly and horizontally from a top and a bottom of the fan frame 31, respectively. Each of the upper and lower flanges 32, 34 defines four through holes 36 in four corners thereof.

Each of the fan holders 20 is made of a metallic material with elasticity. Each fan holder 20 is mounted around the heat sink 10, and the fan 30 is mounted on the fan holders 20. Each fan holder 20 is closed and strip-shaped, and has four side portions connected together, i.e. a top side portion, a bottom side portion, a front side portion and a rear side portion. The top side portion and the bottom side portion of the fan holder 20 respectively elastically abut against a top and a bottom of the heat sink 10. The front side portion and the rear side portion of the fan holder 20 respectively elastically abut against a front and a rear of the heat sink 10. Each side portion of the fan holder 20 includes two portions, i.e. a slide portion and a sheath, connected each other. Each slide portion is received in a corresponding sheath and can slide along the sheath to adjust the entire length of the side portion.

Figure 3:
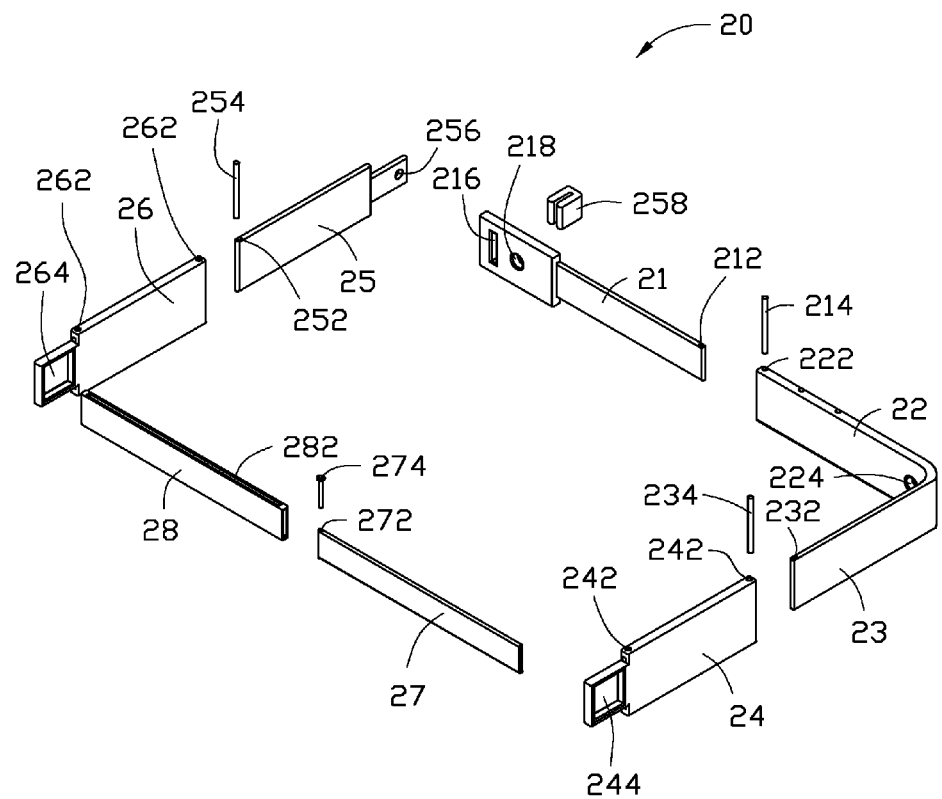
FIG. 3 is an enlarged, exploded, isometric view of a fan holder of the heat dissipation device of FIG. 1.

Also referring to FIG. 3, the top side portion of the fan holder 20 includes a first slide portion 21 and a first sheath 22 connected each other. The first slide portion 21 defines a fixing hole 212 in a front end thereof. The first sheath 22 defines three spaced adjusting holes 222 in a rear end thereof. When the front end of the first slide portion 21 is inserted in the rear end of the first sheath 22 with the fixing hole 212 aligned with one of the three adjusting holes 222, a pin 214 can extend through the one of the three adjusting holes 222 of the first sheath 22 and the fixing hole 212 of the first slide portion 21 to connect the first slide portion 21 and the first sheath 22 together. The entire length of the top side portion can be adjusted to fit different widths of fans and heat sinks by shifting the positions of the adjusting holes 222 to position a selected adjusting hole 222 where the pin 214 extends.

In this embodiment, the pin 214 extends through a middle one of the adjusting holes 222 of the first sheath 22, and through the fixing hole 212 of the first slide portion 21, to make the entire length of the top side portion match the width of the heat sink 10. A width of a rear end of the first slide portion 21 far from the first sheath 22 is larger than a width of the end of the first slide portion 21 connecting the first sheath 22. The first slide portion 21 defines a rectangular through hole 216 and a circular mounting hole 218 in the rear end thereof. The first sheath 22 defines a circular mounting hole 224 in a front end thereof away from the first slide portion 21. The mounting hole 218 of the first slide portion 21 and the mounting hole 224 of the first sheath 22 correspond with the through holes 36 of the lower flange 34 of the fan 30.

The front side portion of the fan holder 20 includes a second slide portion 23 and a second sheath 24 connected to each other. The second slide portion 23 defines a fixing hole 232 in a bottom end thereof. The second sheath 24 defines two spaced adjusting holes 242 in a top end thereof. When the bottom end of the second slide portion 23 is received in the top end of the second sheath 24, a pin 234 can extend through one of the two adjusting holes 242 of the second sheath 24 and the fixing hole 232 of the second slide portion 23 to connect the second slide portion 23 and the second sheath 24 together. The entire length of the front side portion can be adjusted to fit different heights of heat sinks by shifting the positions of the adjusting holes 242 to position a selected adjusting hole 242 where the pin 234 extends.

In this embodiment, the pin 234 extends through the adjusting hole 242 of the second sheath 24 defined near the fixing hole 232, and through the fixing hole 232 of the second slide portion 23, to make the entire length of the front side portion match the height of the heat sink 10. The second slide portion 23 and the first sheath 22 of the top side portion are integrally formed as one monolithic piece. The second sheath 24 defines a rectangular mounting hole 244 in a bottom end thereof away from the second slide portion 23.

The rear side portion of the fan holder 20 includes a third slide portion 25 and a third sheath 26 connected to each other. The third slide portion 25 defines a fixing hole 252 in a bottom end thereof. The third sheath 26 defines two spaced adjusting holes 262 in a top end thereof. When the third slide portion 25 is received in the third sheath 26, a pin 254 can extend through one of the two adjusting holes 262 of the third sheath 26 and the fixing hole 252 of the third slide portion 25 to connect the third slide portion 25 and the third sheath 26 together. The entire length of the rear side portion can be adjusted to fit different heights of heat sinks by shifting the positions of the adjusting holes 262 to position a selected adjusting hole 262 where the pin 254 extends.

In this embodiment, the pin 254 extends through the adjusting hole 262 of the third sheath 26 defined near the fixing hole 252, and through the fixing hole 252 of the third slide portion 25, to make the entire length of the rear side portion match the height of the heat sink 10. A width of a top end of the third slide portion 25 far from the third sheath 26 is smaller than a width of the bottom of the third slide portion 25 connecting the third sheath 26. The third slide portion 25 defines a buckle hole 256 in the top end thereof. The top end of the third slide portion 25 extends through the through hole 216 of the first slide portion 21, and a buckle block 258 is buckled in the buckle hole 256 of the third slide portion 25 to connect the third slide portion 25 and the first slide portion 21 together. The third sheath 26 defines a rectangular mounting hole 264 in a bottom end thereof away from the third slide portion 25.

The bottom side portion of the fan holder 20 includes a fourth slide portion 27 and a fourth sheath 28 connected to each other. The fourth slide portion 27 defines a fixing hole 272 in a rear end thereof. The fourth sheath 28 defines an elongated slide groove 282 in a lateral side thereof. When the fourth slide portion 27 is received in the fourth sheath 28, a pin 274 can extend through the slide groove 282 of the fourth sheath 28 and through the fixing hole 272 of the fourth slide portion 27 to connect the fourth slide portion 27 and the fourth sheath 28 together. A front end of the fourth slide portion 27 away from the fourth sheath 28 can extend through the through hole 244 of the second sheath 24. A rear end of the fourth sheath 28 away from the fourth slide portion 27 can extend through the through hole 264 of the third sheath 26.

In assembly, the two fasteners 20 are mounted on the heat sink 10, and located adjacent to left and right sides of the heat sink 10, respectively. The bottom side portion of the fan holder 20 is arranged under the base of the heat sink 10, while the top side portion, the front side portion and the rear side portion of the fan holder 20 are respectively disposed at the top, front and rear of the heat sink 10. The fourth slide portion 27 extends through the through hole 244 of the second sheath 24, and the fourth sheath 28 extends through the through hole 264 of the third sheath 26, so that the fourth slide portion 27 and the fourth sheath 28 elastically contact the bottom of the heat sink 10. The fan 30 is placed on the heat sink 10 with the through holes 36 thereof aligned with the mounting holes 218 and 224 of the fan holder 20. Four fasteners 38 such as screws extend through the through holes 36 of the lower flange 34 of the fan 30, and engage in the mounting holes 218 of the first slide portions 21 and the mounting holes 224 of the first sheaths 22 of the fan holders 20. Thus the fan 30 is fixed on the heat sink 10.

Figure 4:
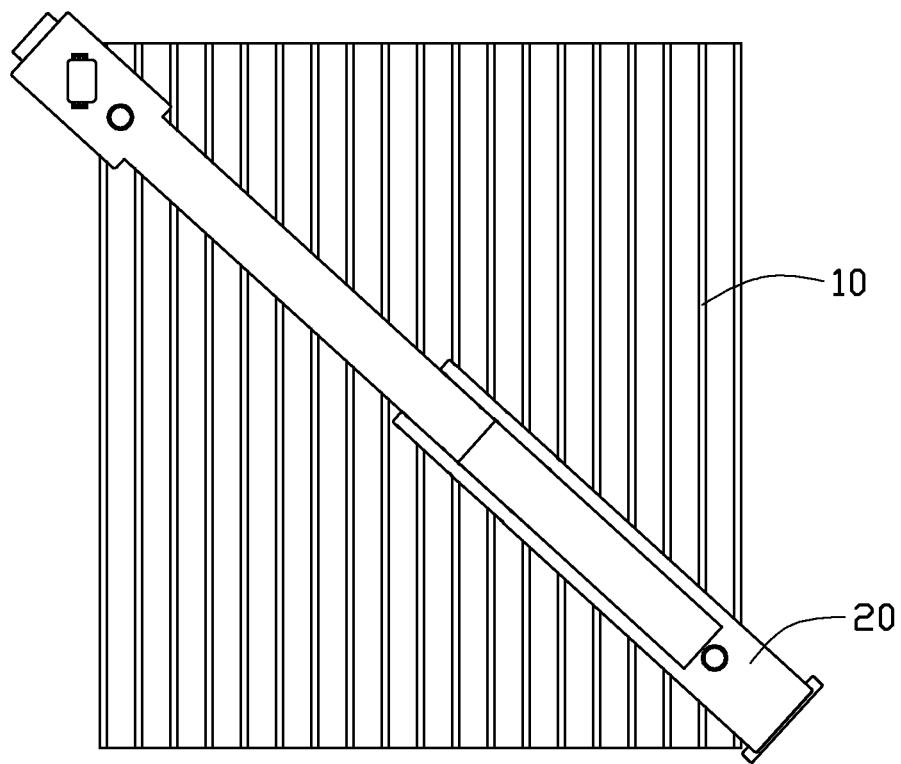
FIG. 4 is a top plan view of a heat dissipation device in accordance with a second embodiment of the disclosure.

FIG. 4 shows a heat dissipation device in accordance with a second embodiment. The differences between the heat dissipation device of the second embodiment and the heat dissipation device of the first embodiment are as follows. The heat dissipation device of the second embodiment requires only one fan holder 20 to fix the fan 30 on the heat sink 10, and the fan holder 20 is disposed along a diagonal direction of the fan 30 and the heat sink 10.

According to the disclosure, the size of the fan holder 20 can be adjusted according to the size of the fan 30 and heat sink 10, to achieve fixing of the fan 30 on the heat sink 10 even when the fan 30 and the heat sink 10 are replaced with a fan 30 and a heat sink 10 of another size. Thus the overall cost of the heat dissipation device can be reduced.

It is believed that the disclosure and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:
   a heat sink;
   a fan mounted on the heat sink; and
   a fan holder mounted around the heat sink, the fan being fixed on the fan holder, the fan holder being strip-shaped, and comprising a top side portion, a bottom side portion, a front side portion and a rear side portion joined together, the top side portion and the bottom side portion of the fan holder respectively abutting against a top and a bottom of the heat sink, the front side portion and the rear side portion of the fan holder respectively abutting against a front and a rear of the heat sink, at least one of the side portions of the fan holder comprising a slide portion and a sheath connected each other, wherein a position where the slide portion and the sheath of the at least one of the side portions are connected can be adjusted to change a length of the at least one of the side portions;
   wherein each side portion of the fan holder comprises a slide portion and a sheath connected each other, each slide portion is received in a corresponding sheath and can slide along the sheath to adjust the entire length of the side portion; and
   wherein the slide portion of the top side portion defines a fixing hole in an end thereof, and the sheath of the top side portion defines a plurality of adjusting holes in an end thereof, a pin extending through one of the adjusting holes of the sheath and the fixing hole of the slide portion to connect the slide portion and the sheath of the top side portion together.

2. The heat dissipation device of claim 1, wherein the slide portion of the top side portion defines a mounting hole in the other end thereof, the sheath defining a mounting hole in the other end thereof, the fan comprising a fan frame, two through holes being defined in corners of the fan frame, two fasteners extending through the through holes of the fan and engage in the mounting holes of the top side portion to fix the fan on the fan holder.

3. The heat dissipation device of claim 1, wherein the slide portion of the front side portion defines a fixing hole in an end thereof, and the sheath of the front side portion defines a plurality of adjusting holes in an end thereof, a pin extending through one of the adjusting holes of the sheath and the fixing hole of the slide portion to connect the slide portion and the sheath of the front side portion together.

4. The heat dissipation device of claim 3, wherein the slide portion of the front side portion and the sheath of the top side portion are integrally formed as one monolithic piece.

5. The heat dissipation device of claim 3, wherein the slide portion of the rear side portion defines a fixing hole in an end thereof, and the sheath of the rear side portion defines a plurality of adjusting holes in an end thereof, a pin extending through one of the adjusting holes of the sheath and the fixing hole of the slide portion to connect the slide portion and the sheath of the rear side portion together.

6. The heat dissipation device of claim 5, wherein the slide portion of the top side portion defines a through hole in the other end thereof, the slide portion of the rear side portion defining a buckle hole in the other end thereof, the other end of the slide portion of the rear side portion extending through the through hole of the slide portion of the top side portion, a buckle block being buckled in the buckle hole of the rear side portion to connect the rear side portion and the top side portion together.

7. The heat dissipation device of claim 5, wherein the slide portion of the bottom side portion defines a fixing hole in an end thereof, and the sheath of the bottom side portion defines an elongated slide groove, a pin extending through the slide groove of the sheath and the fixing hole of the slide portion to connect the slide portion and the sheath of the bottom side portion together.

8. The heat dissipation device of claim 7, wherein the sheath of the front side portion defines a mounting hole in the other end thereof, the sheath of the rear side portion defining a mounting hole in the other end thereof, the other end of the slide portion of the bottom side portion extending through the through hole of the sheath of the front side portion, one end of the sheath of the bottom side portion extending through the through hole of the sheath of the rear side portion, whereby the bottom side portion elastically contact the bottom of the heat sink.

9. A fan holder adapted for fixing a fan onto a heat sink, the fan holder being strip-shaped, and comprising a top side portion, a bottom side portion, a front side portion and a rear side portion joined together, at least one of the side portions of the fan holder comprising a slide portion and a sheath connected each other, wherein a position where the slide portion and the sheath of the at least one of the side portions are connected can be adjusted to change a length of the at least one of the side portions;

wherein each side portion of the fan holder comprises a slide portion and a sheath connected each other, each slide portion is received in a corresponding sheath and can slide along the sheath to adjust the entire length of the side portion; and wherein the slide portion of the top side portion defines a fixing hole in an end thereof, and the sheath of the top side portion defines a plurality of adjusting holes in an end thereof, a pin extending through one of the adjusting holes of the sheath and the fixing hole of the slide portion to connect the slide portion and the sheath of the top side portion together.

10. The fan holder of claim 9, wherein the slide portion of the top side portion defines a mounting hole in the other end thereof, the sheath defining a mounting hole in the other end thereof.

11. The fan holder of claim 9, wherein the slide portion of the front side portion defines a fixing hole in an end thereof, and the sheath of the front side portion defines a plurality of adjusting holes in an end thereof, a pin extending through one of the adjusting holes of the sheath and the fixing hole of the slide portion to connect the slide portion and the sheath of the front side portion together.

12. The fan holder of claim 11, wherein the slide portion of the front side portion and the sheath of the top side portion are integrally formed as one monolithic piece.

13. The fan holder of claim 11, wherein the slide portion of the rear side portion defines a fixing hole in an end thereof, and the sheath of the rear side portion defines a plurality of adjusting holes in an end thereof, a pin extending through one of the adjusting holes of the sheath and the fixing hole of the slide portion to connect the slide portion and the sheath of the rear side portion together.

14. The fan holder of claim 13, wherein the slide portion of the top side portion defines a through hole in the other end thereof, the slide portion of the rear side portion defining a buckle hole in the other end thereof, the other end of the slide portion of the rear side portion extending through the through hole of the slide portion of the top side portion, a buckle block being buckled in the buckle hole of the rear side portion to connect the rear side portion and the top side portion together.

15. The fan holder of claim 13, wherein the slide portion of the bottom side portion defines a fixing hole in an end thereof, and the sheath of the bottom side portion defines an elongated slide groove, a pin extending through the slide groove of the sheath and the fixing hole of the slide portion to connect the slide portion and the sheath of the bottom side portion together.

16. The fan holder of claim 15, wherein the sheath of the front side portion defines a mounting hole in the other end thereof, the sheath of the rear side portion defining a mounting hole in the other end thereof, the other end of the slide portion of the bottom side portion extending through the through hole of the sheath of the front side portion, one end of the sheath of the bottom side portion extending through the through hole of the sheath of the rear side portion.

* * * * *